United States Patent
Tanaka et al.

(10) Patent No.: US 8,450,146 B2
(45) Date of Patent: May 28, 2013

(54) TRANSISTOR ASSEMBLY AND METHOD FOR MANUFACTURING THE SAME

(75) Inventors: Kenichiro Tanaka, Osaka (JP); Tetsuzo Ueda, Osaka (JP); Hisayoshi Matsuo, Toyama (JP); Masahiro Hikita, Toyama (JP)

(73) Assignee: Panasonic Corporation, Osaka (JP)

( * ) Notice: Subject to any disclaimer, the term of this patent is extended or adjusted under 35 U.S.C. 154(b) by 39 days.

(21) Appl. No.: 13/213,967

(22) Filed: Aug. 19, 2011

(65) Prior Publication Data

US 2011/0297960 A1 Dec. 8, 2011

Related U.S. Application Data

(63) Continuation of application No. PCT/JP2009/005404, filed on Oct. 16, 2009.

(30) Foreign Application Priority Data

Feb. 26, 2009 (JP) ................................. 2009-043783

(51) Int. Cl.
*H01L 21/00* (2006.01)
*H01L 21/338* (2006.01)
*H01L 21/331* (2006.01)
*H01L 21/8222* (2006.01)
*H01L 21/336* (2006.01)

(52) U.S. Cl.
USPC ............. 438/105; 438/46; 438/172; 438/317; 438/285; 438/197

(58) Field of Classification Search
USPC .................... 257/183, 192, 76; 438/105, 106, 438/285, 2, 46, 47, 172, 590, 191, 235, 312–321, 518, 572, 767, 48, 322, 197
See application file for complete search history.

(56) References Cited

U.S. PATENT DOCUMENTS 7,067,846 B2 * 6/2006 Takahashi et al. .............. 257/79
(Continued)

FOREIGN PATENT DOCUMENTS

JP 07-176553 7/1995
JP 08-195402 7/1996
(Continued)

OTHER PUBLICATIONS

Arulkumaran, S., et al., "Enhancement of breakdown voltage by AIN buffer layer thickness in AlGaN/GaN high-electron-mobility transistors on 4 in. diameter silicon", Applied Physics Letters, 2005, vol. 86, American Institute of Physics.

(Continued)

*Primary Examiner* — Chuong A. Luu
(74) *Attorney, Agent, or Firm* — McDermott Will & Emery LLP

(57) ABSTRACT

A method for manufacturing a transistor assembly includes the steps of: (a) forming a transistor; (b) polishing a base substrate; and (c) securing the transistor of which the base substrate is polished to a support substrate. The step (a) is a step of forming a first semiconductor layer and a second semiconductor layer on a principle surface of the base substrate. The step (b) is a step of polishing a surface of the base substrate opposite to the principle surface. The step (c) is a step of securing the transistor on the support substrate in the presence of a stress applied on the base substrate in such a direction that a warp of the base substrate is reduced. The base substrate is made of a material different from that of the first semiconductor layer and the second semiconductor layer, and a tensile stress is applied on the second semiconductor layer.

11 Claims, 14 Drawing Sheets

U.S. PATENT DOCUMENTS

| | | |
|---|---|---|
| 2006/0138457 A1 | 6/2006 | Otsuka et al. |
| 2007/0051977 A1* | 3/2007 | Saito et al. .................... 257/192 |
| 2012/0211726 A1* | 8/2012 | Chui et al. ...................... 257/24 |

FOREIGN PATENT DOCUMENTS

| | | |
|---|---|---|
| JP | 2004-241623 | 8/2004 |
| JP | 2005-044959 | 2/2005 |
| WO | WO 2005/024955 A1 | 3/2005 |

OTHER PUBLICATIONS

Binari, S.C., et al., "Fabrication and Characterization of GaN FETs", Solid-State Electronics, 1997, pp. 1549-1554, vol. 41, No. 10, Elsevier Science Ltd., Great Britian.

* cited by examiner

THEORETICAL VALUE OF LATTICE CONSTANT

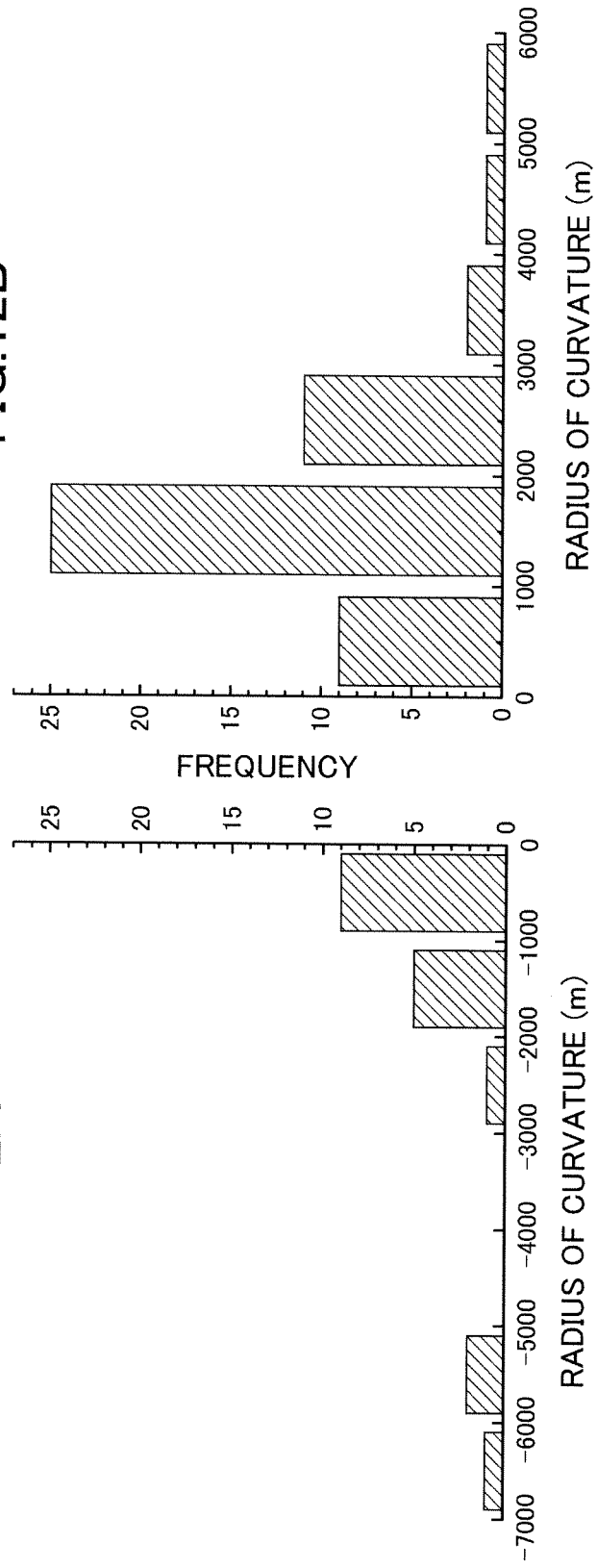
FIG.12B
FIG.12A
FIG.12D
FIG.12C

TRANSISTOR ASSEMBLY AND METHOD FOR MANUFACTURING THE SAME

CROSS-REFERENCE TO RELATED APPLICATION

This is a continuation of PCT International Application PCT/JP2009/005404 filed on Oct. 16, 2009, which claims priority to Japanese Patent Application No. 2009-043783 filed on Feb. 26, 2009. The disclosures of these applications including the specifications, the drawings, and the claims are hereby incorporated by reference in its entirety.

BACKGROUND

The present invention relates to a transistor assembly and a method for manufacturing the same, and particularly to an assembly of a power transistor, or the like, using a nitride semiconductor and a method for manufacturing the same.

A nitride semiconductor such as gallium nitride (GaN) has a greater bandgap, a greater breakdown electric field and a greater electron saturated drift velocity as compared with silicon (Si), gallium arsenide (GaAs), etc. In a hetero structure between aluminum gallium nitride (AlGaN) and gallium nitride (GaN), a 2-dimensional electron gas (2DEG) is generated at the hetero interface due to spontaneous polarization and piezo polarization, thereby obtaining a sheet carrier concentration of $1 \times 10^{13}$ cm$^{-2}$ or more without impurity doping. High electron mobility transistors (HEMTs) using the high-concentration 2-dimensional electron gas as a carrier have been attracting public attention in recent years, and HEMTs of various structures have been proposed in the art (see, for example, S. Arulkumaran, et al., "Enhancement of breakdown voltage by AlN buffer layer thickness in AlGaN/GaN high-electron-mobility transistors on 4 in. diameter silicon", APPLIED PHYSICS LETTERS, 2005, vol. 86, P. 123503).

SUMMARY

Where such an HEMT using a nitride semiconductor is used as a switching element, or the like, the characteristics of channel resistance and current collapse are very important. When an HEMT having a high channel resistance is used as a switching element, there is a significant heat generation due to thermal loss, thereby making the device operation unstable. The heat generation further increases the channel resistance, which may eventually break the device.

Current collapse is a phenomenon in which the current flow stops for a certain period of time when a switch is once turned OFF and then turned back ON. A poor current collapse characteristic makes it difficult to realize fast switching, and causes very serious problems for the operation of the device.

The present inventors have found a method for significantly reducing the channel resistance when mounting an HEMT. It has also been found that it is possible to improve the current collapse characteristic by reducing the channel resistance.

An object of the present disclosure is to realize a transistor assembly having a significantly reduced channel resistance by using the method for reducing the channel resistance of an HEMT found by the present inventors.

In order to achieve the object set forth above, an example method for manufacturing a transistor assembly is a method in which a transistor is secured on a support substrate in the presence of a stress on the transistor.

Specifically, an example method for manufacturing a transistor assembly includes the steps of: (a) forming a transistor including a first semiconductor layer and a second semiconductor layer having a greater bandgap than the first semiconductor layer, layered in this order on a principle surface of a base substrate; (b) polishing a surface of the base substrate opposite to the principle surface thereof, after the step (a); and (c) securing the transistor on a support substrate in the presence of a stress applied on the base substrate in such a direction that a warp of the base substrate is reduced, after the step (b), wherein the base substrate is made of a material different from that of the first semiconductor layer and the second semiconductor layer, and a tensile stress is applied on the second semiconductor layer.

With the example method for manufacturing a transistor assembly, the base substrate of the transistor secured on the support substrate has a reduced warp. Therefore, the distortion of the first semiconductor layer is relaxed, and the lattice constant of the first semiconductor layer comes closer to the theoretical value in the case of a bulk. Therefore, it is possible to maintain a large lattice constant difference between the first semiconductor layer and the second semiconductor layer, thereby applying a large tensile stress on the second semiconductor layer. As the tensile stress applied on the second semiconductor layer increases, the piezo polarization of the second semiconductor layer increases, thereby increasing the sheet carrier concentration of the 2-dimensional electron gas layer. As a result, it is possible to realize a transistor assembly with a low channel resistance. The current collapse characteristic also improves as the channel resistance decreases.

In the example method for manufacturing a transistor assembly, in the step (c), after the stress is applied on the base substrate, the base substrate and the support substrate may be bonded together while maintaining the stress.

In the example method for manufacturing a transistor assembly, the stress may be applied by pressing the transistor using a press pad. Alternatively, the stress may be applied by pressing the transistor using a stress application jig. In this case, the stress application jig may include: a press pad opposing the support substrate with the transistor interposed therebetween; and a press section pressing the press pad toward the support substrate.

In the example method for manufacturing a transistor assembly, the step (c) includes the steps of: forming a solder layer on the support substrate; placing the transistor on the support substrate while the solder layer is melted; pressing the transistor while the solder layer is melted; and solidifying the solder layer while the transistor is pressed.

In the example method for manufacturing a transistor assembly, in the step (c), the solidification is performed so that a value of a c-axis lattice constant of the first semiconductor layer is 99.9% or more and 100.1% or less of a theoretical value of a c-axis lattice constant of a material of the first semiconductor layer.

In the example method for manufacturing a transistor assembly, in the step (c), the solidification is performed so that a radius of curvature of the base substrate is greater than or equal to 12000 m.

The example method for manufacturing a transistor assembly may further include the step of: (d) forming, on the second semiconductor layer, a stress-applying film for applying a stress on the base substrate, before the step (c). Alternatively, it may further include the step of: (d) forming, on a surface of the base substrate opposite to the principle surface thereof, a stress-applying film for applying a stress on the base substrate, before the step (c).

In the example method for manufacturing a transistor assembly, the base substrate may be a silicon substrate, and the first semiconductor layer may be gallium nitride.

A first transistor assembly includes: a support substrate; and a transistor secured on the support substrate, wherein the transistor includes a first semiconductor layer and a second semiconductor layer having a greater bandgap than the first semiconductor layer, layered in this order on a principle surface of a base substrate, the base substrate is made of a material different from that of the first semiconductor layer and the second semiconductor layer, and a tensile stress is applied on the second semiconductor layer, and a value of a c-axis lattice constant of the first semiconductor layer is 99.9% or more and 100.1% or less of a theoretical value of a c-axis lattice constant of a material of the first semiconductor layer.

In the first transistor assembly, the value of the c-axis lattice constant of the first semiconductor layer is 99.9% or more and 100.1% or less of the theoretical value of the c-axis lattice constant of the material of the first semiconductor layer. Therefore, it is possible to maintain a large lattice constant difference between the first semiconductor layer and the second semiconductor layer, thereby applying a large tensile stress on the second semiconductor layer. Therefore, the piezo polarization of the second semiconductor layer increases, thereby increasing the sheet carrier concentration of the 2-dimensional electron gas layer. As a result, it is possible to reduce the channel resistance. The current collapse characteristic also improves.

A second transistor assembly includes: a support substrate; and a transistor secured on the support substrate, wherein the transistor includes a first semiconductor layer and a second semiconductor layer having a greater bandgap than the first semiconductor layer, layered in this order on a principle surface of a base substrate, the base substrate is made of a material different from that of the first semiconductor layer and the second semiconductor layer, a tensile stress is applied on the second semiconductor layer, and a radius of curvature of the base substrate is greater than or equal to 12000 m.

In the second transistor assembly, the radius of curvature of the base substrate is greater than or equal to 12000 m. Therefore, it is possible to relax the distortion introduced into the first semiconductor layer. Thus, the lattice constant of the first semiconductor layer comes closer to the theoretical value in the case of a bulk, and it is therefore possible to maintain a large lattice constant difference between the first semiconductor layer and the second semiconductor layer. Therefore, the piezo polarization of the second semiconductor layer increases, thereby increasing the sheet carrier concentration of the 2-dimensional electron gas layer. As a result, it is possible to reduce the channel resistance. The current collapse characteristic also improves.

The first or second transistor assembly may further include a stress application jig for applying a stress on the base substrate.

In the first or second transistor assembly, the stress application jig includes: a press pad provided so as to oppose the support substrate with the transistor interposed therebetween; and a spring provided between the support substrate and the press pad for pulling the press pad toward the support substrate. Alternatively, the stress application jig may include: a press pad provided so as to oppose the support substrate with the transistor interposed therebetween; a frame fixed to the support substrate; and a spring provided between the frame and the press pad for pressing the press pad toward the support substrate.

The first or second transistor assembly may further include a stress-applying film formed on the second semiconductor layer for applying a stress in such a direction that a warp of the base substrate is reduced.

The first or second transistor assembly may further include a stress-applying film, formed on a surface of the base substrate opposite to the principle surface, for applying a stress in such a direction that a warp of the base substrate is reduced.

In the first or second transistor assembly, the base substrate may be a silicon substrate, and the first semiconductor layer may be gallium nitride.

BRIEF DESCRIPTION OF THE DRAWINGS

FIGS. 4A and 4B each show a state of a GaN layer and an AlGaN layer influenced by a warp of a substrate, wherein FIG. 4A is a case where the warp of the substrate is large and FIG. 4B is a case where the warp of the substrate is small.

FIGS. 12A-12D are graphs showing the distribution of the radius of curvature of the substrate in a case where the thickness of a first semiconductor layer is 3 μm.

DETAILED DESCRIPTION

First, the principle of a method for reducing the channel resistance of a high electron mobility transistor (HEMT) found by the present inventors will be described.

Figure 1:
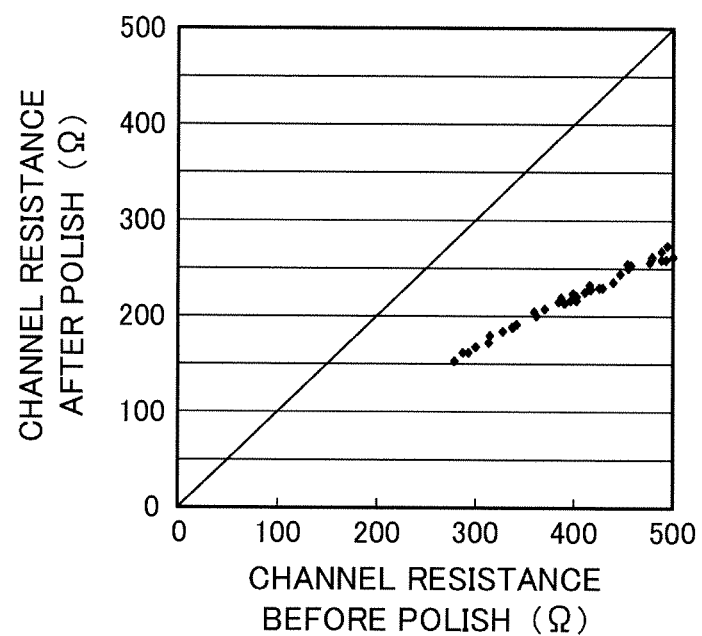
FIG. 1 is a graph showing the relationship between the channel resistance before polishing a transistor substrate and that after polishing the transistor substrate.

The present inventors found that if one measures the channel resistance of an HEMT formed on a silicon (Si) substrate having a thickness of 525 μm, and then measures the channel resistance again after polishing the substrate by about 200 μm, the channel resistance is reduced significantly. FIG. 1 shows the result of measuring the channel resistance $R_{bf}$ of an HEMT before polishing the substrate and that after polishing the substrate, wherein the vertical axis is the measurement value after polishing the substrate and the horizontal axis is the measurement value before polishing the substrate. As shown in FIG. 1, the value of the channel resistance $R_{bf}$ was reduced to about ½ by polishing the substrate. The value of the channel resistance $R_{bf}$ was obtained by measuring the source-drain resistance value in the presence of a voltage of 0 V applied to the substrate, the source electrode and the gate electrode and a voltage of 2 V applied to the drain electrode.

Figure 2A:
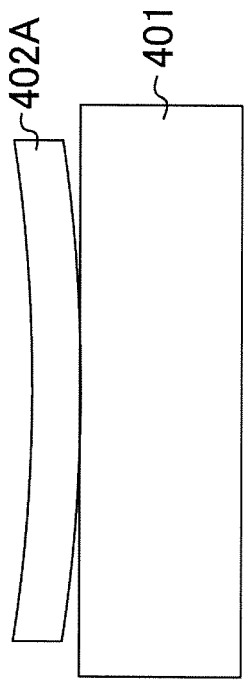
FIGS. 2A-2D are cross-sectional views each showing a state of a transistor when the channel resistance is measured.
Figure 2B:
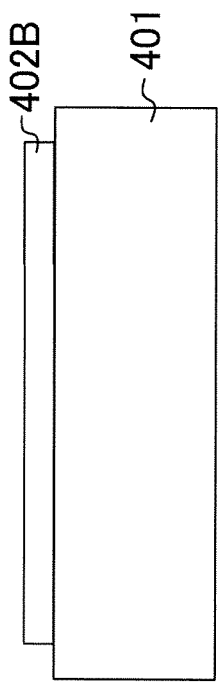
Figure 2C:
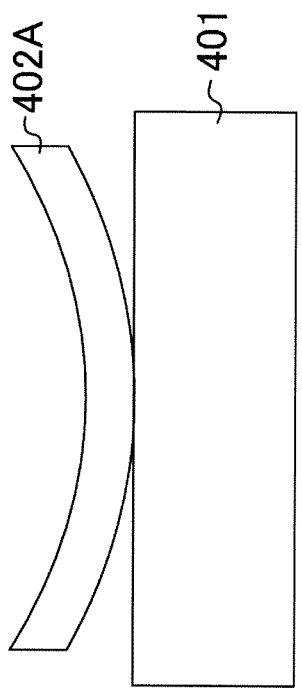
Figure 2D:
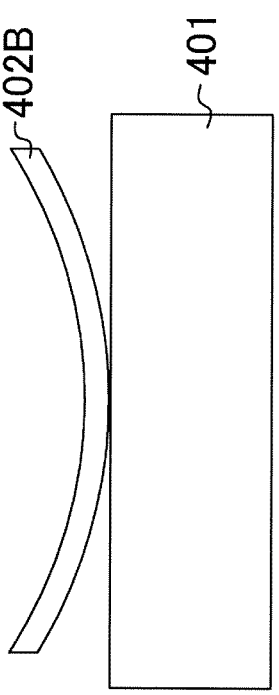

The present inventors made the following assumption as to the cause by which the channel resistance is reduced by polishing the substrate of an HEMT. In order to measure the channel resistance of an HEMT in the form of a chip, the HEMT is secured to a vacuum chuck. If the substrate is thick, securing the HEMT on a vacuum chuck does not significantly change the shape of the substrate. However, if the substrate is thin, the substrate is flattened when it is secured to a vacuum chuck. For example, with a substrate having a thickness of 525 μm, the radius of curvature R1 of a substrate 402A before it was secured to a vacuum chuck 401 was 1840 m as shown in FIG. 2A. As shown in FIG. 2B, the radius of curvature R2 of the substrate 402A after it was secured to the vacuum chuck 401 was 3325 m. On the other hand, as shown in FIG. 2C, with a substrate 402B having been polished by about 200 the radius of curvature R3 before it was secured to the vacuum chuck 401 was 716 m, which was smaller than the radius of curvature R1 of the substrate 402A before the polish. However, as shown in FIG. 2D, if the polished substrate 402B was secured to the vacuum chuck 401, the radius of curvature R4 was greater than or equal to 12000 m, which is the limit of measurement.

Thus, where the substrate had been polished, the channel resistance was measured with the substrate being less warped. It is believed that the radius of curvature was reduced by polishing the substrate because the stress from the substrate was relaxed because the substrate was thinned. It is believed that on the other hand, the thinned substrate was more easily deformed, so that when secured to a vacuum chuck, the radius of curvature increased and the flatness improved from before polishing the substrate. Therefore, it is believed that the channel resistance was not reduced because of the polishing of the substrate itself, but because the radius of curvature of the substrate increased, i.e., the warp of the substrate reduced, as it was secured to a vacuum chuck.

It is believed that the cause by which the warp of the substrate increases and the radius of curvature decreases to be about 1000 m to about 2000 m when an HEMT is formed on an Si substrate is the lattice constant difference, the difference in coefficient of thermal expansion, etc., between Si and a nitride semiconductor. Thus, It is believed that where the substrate warps, the nitride semiconductor layer formed on the substrate also warps, causing a distortion to the nitride semiconductor layer.

Figure 3:
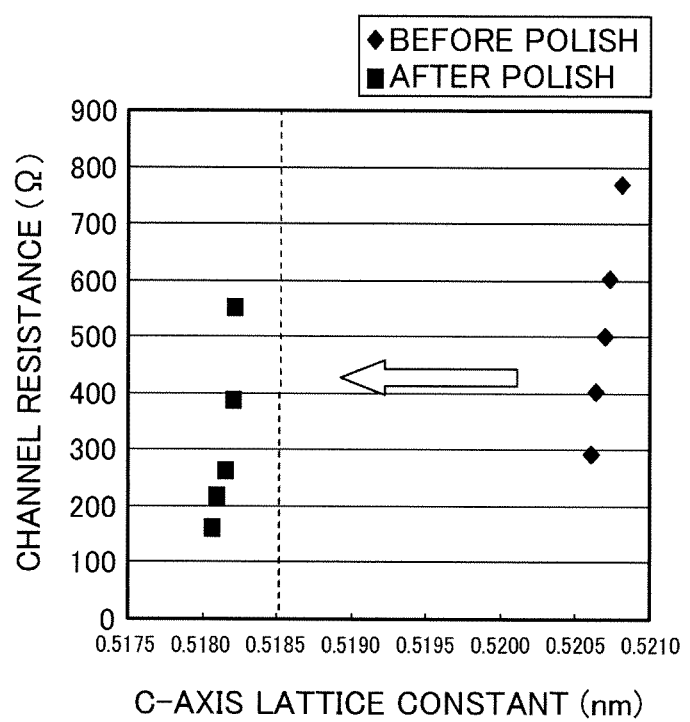
FIG. 3 is a graph showing the relationship between the c-axis lattice constant of GaN crystal and the channel resistance.

FIG. 3 shows the relationship between the lattice constant in the c-axis direction of the GaN layer of an HEMT formed on an Si substrate, and the channel resistance thereof. The lattice constant was calculated based on the X-ray diffraction intensity measured by a θ-2θ method. It is believed that since the HEMT is vacuum-chucked when measuring the X-ray diffraction, the radius of curvature of the substrate is about 3000 m where the substrate has not been polished and is greater than or equal to 12000 m where the substrate has been polished. As shown in FIG. 3, the c-axis lattice constant, which was 0.5205 nm or more where the substrate had not been polished, was about 0.5180 nm where the substrate had been polished. The theoretical value of the c-axis lattice constant of a bulk GaN single crystal is 0.5185 nm, and the deviation from the theoretical value where the substrate had been polished was within 0.1%. The closer the c-axis lattice constant of the GaN layer is to the theoretical value, the smaller the channel resistance.

Figure 4A:
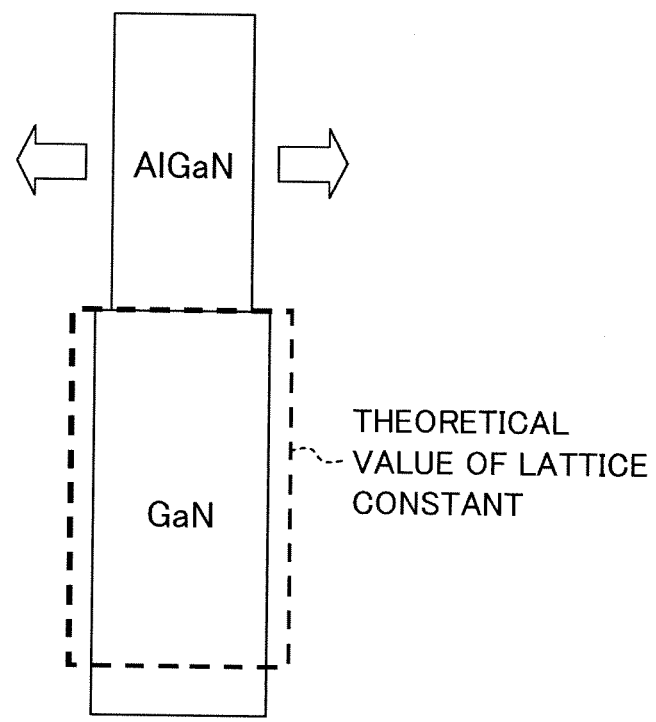
Figure 4B:
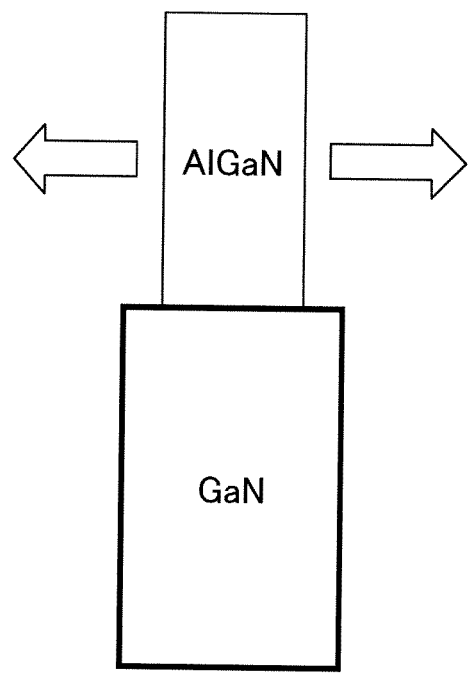

The c-axis lattice constant of the GaN layer being greater than the theoretical value means that the GaN crystal is stretched and distorted in the c-axis direction. Since a crystal stretched in the c-axis direction is shrunk in the a-axis direction, the a-axis lattice constant is smaller than the theoretical value. Therefore, as shown in FIG. 4A, the difference in a-axis lattice constant between the GaN layer and the AlGaN layer is reduced. Thus, the tensile stress acting on the AlGaN layer is reduced, thereby making it less easy for the piezo polarization to occur. It is believed that the 2DEG carrier concentration decreases as a result, thereby increasing the channel resistance of the HEMT. It is believed that where the substrate is polished and vacuum-chucked, the c-axis lattice constant is substantially equal to the theoretical value and the a-axis lattice constant is also substantially equal to the theoretical value. Therefore, as shown in FIG. 4B, the difference in a-axis lattice constant between the GaN layer and the AlGaN layer increases from before polishing the substrate. This increases the tensile stress acting on the AlGaN layer, and increases the piezo polarization in the AlGaN layer. It is believed that the 2DEG carrier concentration increases as a result, thereby reducing the channel resistance of the HEMT from before polishing the substrate.

Where a nitride semiconductor layer is formed on an Si substrate, since the lattice constant of a nitride semiconductor is smaller than Si, the upper surface side on which the nitride semiconductor layer is formed typically warps in a downwardly-protruding shape. Particularly, where the lattice constant of the growth substrate is greater than the lattice constant of the semiconductor material to be grown thereon, the upper surface side on which the semiconductor layer is formed is likely to warp in a downwardly-protruding shape. The HEMTs used in measurement in FIG. 1 all had their upper surface side warped in a downwardly-protruding shape. However, depending on the crystal growth condition of the nitride semiconductor, the upper surface side may warp in an upwardly-protruding shape. For example, if an AlGaN layer is grown on an AlN layer used as a buffer layer and an undoped GaN layer is grown thereon, the upper surface side tends to warp in an upwardly-protruding shape. Specifically, when an AlN layer having a thickness of 300 nm, an $Al_{0.5}Ga_{0.5}N$ layer having a thickness of 600 nm, and an $Al_{0.2}Ga_{0.8}N$ layer having a thickness of 400 nm were formed in this order on an Si substrate having a thickness of 525 μm, and then an undoped GaN layer was grown to a thickness of 3 μm, the upper surface side warped in an upwardly-protruding shape.

Figure 5:
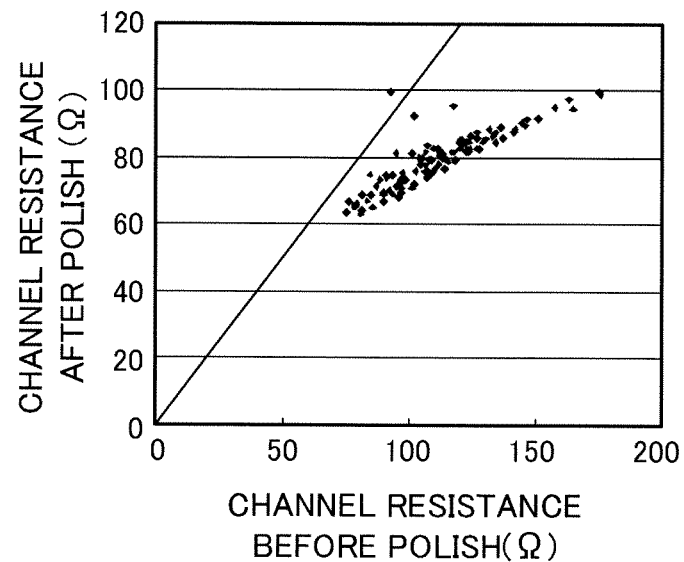
FIG. 5 is a graph showing the channel resistance value before polishing the substrate and that after polishing the substrate of a transistor whose surface is warped in an upwardly-protruding shape.

FIG. 5 shows the result of measuring the channel resistance for HEMTs whose upper surface side is warped in an upwardly-protruding shape before polishing the substrate and that after polishing the substrate. Also for HEMTs whose principle surface side is warped in an upwardly-protruding shape, the channel resistance, as measured after polishing the substrate, decreased to 80%-60% of that before polishing the substrate. Therefore, it is clear that also where the principle surface side is warped in an upwardly-protruding shape, the channel resistance can be reduced by increasing the radius of curvature of the substrate, i.e., reducing the warp of the substrate, thereby reducing the distortion which has been introduced into the GaN layer.

In this case, the radius of curvature of an HEMT whose substrate had a thickness of 525 μm was 460 m before it was secured to a vacuum chuck, and the radius of curvature thereof after it was secured to a vacuum chuck was greater than or equal to 12000 m, which is the limit of measurement. On the other hand, where the substrate was polished by 200 μm, the radius of curvature before it was secured to a vacuum chuck was 230 m, and the radius of curvature after it was secured to a vacuum chuck was greater than or equal to 12000 m. It is believed that when the principle surface side of the substrate is warped in an upwardly-protruding shape, the substrate is more easily brought into close contact with the vacuum chuck, and a greater force is applied on the substrate, than when it is warped in a downwardly-protruding shape, so that the radius of curvature when secured to a vacuum chuck is large even when the substrate is thick. However, it is assumed that the radius of curvature is larger and the warp of the substrate is smaller when the substrate is polished to a smaller thickness also in this case. The channel resistance measurement results also support this assumption.

Figure 6:
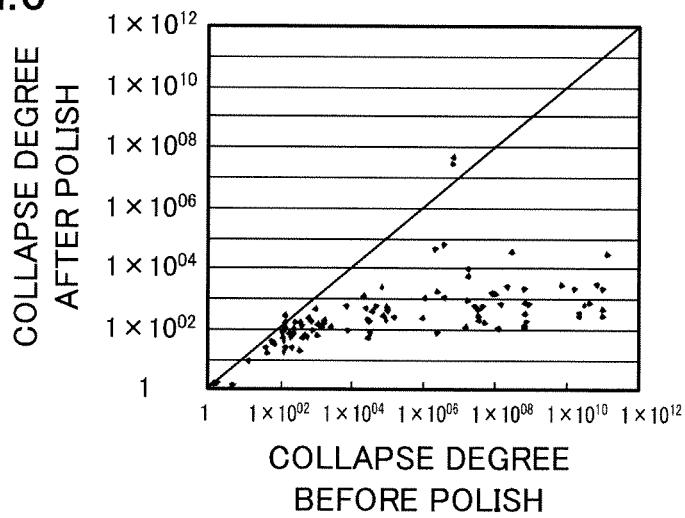
FIG. 6 is a graph showing the relationship between the current collapse degree before polishing the transistor substrate and that after polishing the transistor substrate.

Next, the result of a study on the current collapse will be discussed. FIG. 6 shows the result of measuring the current collapse degrees of HEMTs used in the measurement of the channel resistance shown in FIG. 1. Current collapse is a phenomenon that a current does not easily flow for a certain period of time when an HEMT is once turned OFF and then turned back ON. In this study, the magnitude of the current collapse was evaluated in terms of the current collapse degree, which is defined as the ratio $R_{af}/R_{bf}$ between the normal channel resistance $R_{bf}$ and the channel resistance $R_{af}$ immediately after switching from OFF to ON. $R_{af}$ was defined as the source-drain resistance observed when the application voltage to the drain electrode is switched to 2 V immediately after maintaining, for 30 sec, an applied voltage of 0 V to the source electrode, the gate electrode and the substrate and an applied voltage of 200 V to the drain electrode.

Figure 7:
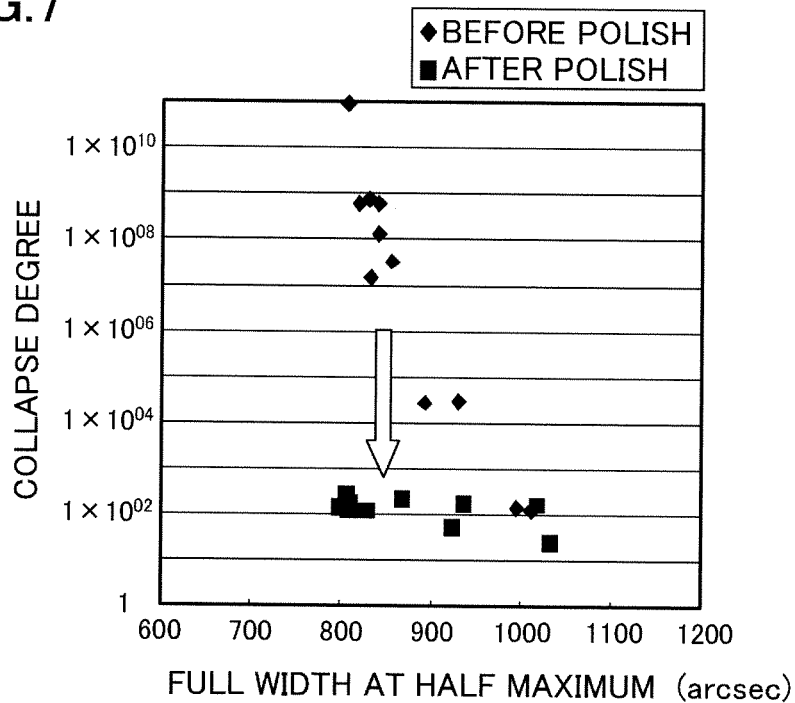
FIG. 7 is a graph showing the relationship between the full width at half maximum and the current collapse degree of the GaN layer.

As shown in FIG. 6, by polishing the substrate, the current collapse degree became much smaller than that before polishing the substrate, and variations also decreased. FIG. 7 shows the relationship between the current collapse degree $R_{af}/R_{bf}$ and the full width at half maximum of the rocking curve obtained by performing X-ray diffraction on the (1012) line of the GaN layer using the ω scan mode. Before polishing the substrate, the current collapse degree $R_{af}/R_{bf}$ varies significantly, and the current collapse degree $R_{af}/R_{bf}$ rapidly deteriorates as the full width at half maximum decreases. On the other hand, when the substrate was polished, the current collapse degree $R_{af}/R_{bf}$ improved significantly as compared to that before polishing the substrate. Particularly, for samples whose full width at half maximum values are about 800 arcsec, the current collapse degree $R_{af}/R_{bf}$ improved by about seven orders of magnitude. The variations of the current collapse degree also decreased. While the current collapse degree is preferably smaller than 1000, this value is sufficiently satisfied when the substrate is polished.

The reason for this phenomenon is not clear. However, since the full width at half maximum did not change substantially through the polish of the substrate, it is unlikely that the current collapse degree improved because of an improvement in the crystallinity of the GaN layer. Thus, the reason for the improvement in the current collapse degree is assumed as follows. It is believed that the current collapse occurs as electrons are trapped in a region where a high electric field is applied when an HEMT is turned OFF and the trapped electrons function similarly to a negative gate voltage when the HEMT is turned back ON, thus constricting the channel. Therefore, the current collapse is unlikely to occur if the electron trap density $N_T$ is sufficiently smaller than the 2DEG electron density $N_s$. When the substrate is polished to decrease the warp, it is believed that the electron trap density $N_T$ does not change but the 2DEG electron density $N_s$ increases. Therefore, it is believed that the ratio $N_T/N_s$ of the electron trap density $N_T$ with respect to the 2DEG electron density $N_s$ relatively decreased, improving the current collapse degree.

Figure 8:
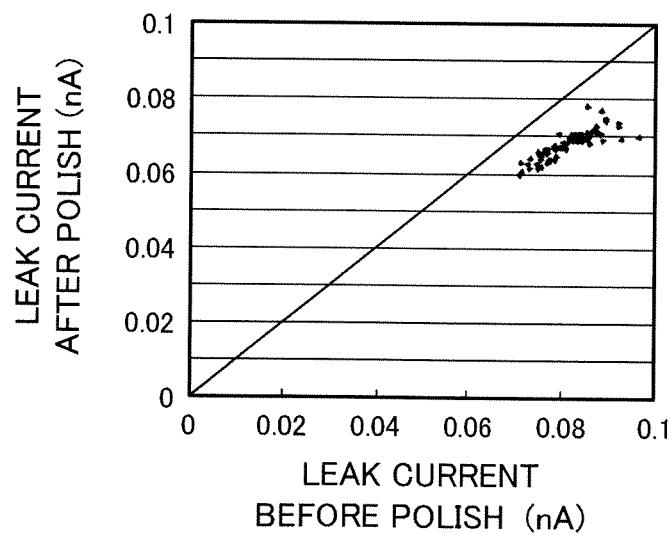
FIG. 8 is a graph showing the relationship between the leak current before polishing the transistor substrate and that after polishing the transistor substrate.

While the current collapse improves, the leak current in the OFF state may increase. However, as shown in FIG. 8, substantially no difference was observed between the leak current value before polishing the substrate and that after polishing the substrate.

As described above, with an HEMT using a nitride semiconductor formed on a heterologous substrate such as an Si substrate, the channel resistance can be reduced by reducing the warp of the substrate. It is also possible to improve the current collapse by reducing the channel resistance. A method for mounting an HEMT with which it is possible to decrease the warp of the substrate of the HEMT and to reduce the channel resistance will now be described by way of a specific example.

Embodiment

Figure 9:
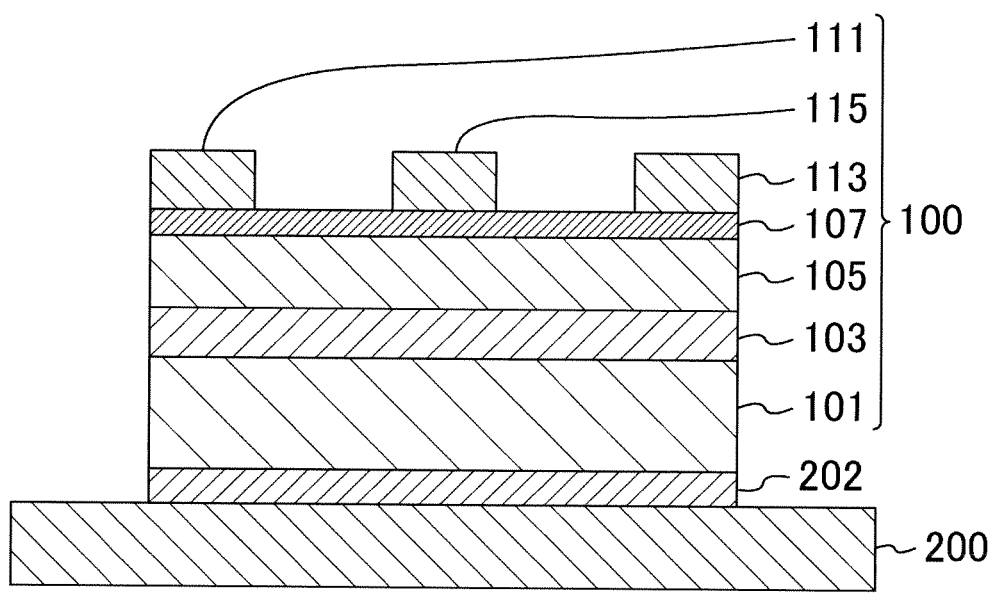
FIG. 9 is a cross-sectional view showing a transistor assembly according to an embodiment.

FIG. 9 shows a cross-sectional structure of a transistor assembly of the present embodiment. As shown in FIG. 9, a transistor assembly of the present embodiment includes an HEMT 100 using a nitride semiconductor secured on a support substrate 200 by a solder layer 202. The HEMT 100 is secured on the support substrate with the radius of curvature of a base substrate 101 being greater than or equal to 12000 m.

The HEMT 100 is formed on the principle surface of the base substrate 101 such as an Si substrate. The base substrate 101 is polished from the side of the surface (reverse surface) opposite to the principle surface to a smaller thickness. A low-temperature buffer layer 103 of aluminum nitride (AlN) is formed on the principle surface of the base substrate 101. A nitride semiconductor layer is formed on the low-temperature buffer layer 103. The nitride semiconductor layer includes a first semiconductor layer 105 of undoped GaN, and a second semiconductor layer 107 of undoped AlGaN formed on the first semiconductor layer 105. A source electrode 111, a gate electrode 115 and a drain electrode 113 are formed on the second semiconductor layer 107. The source electrode 111 and the drain electrode 113 are ohmic electrodes including, for example, titanium (Ti) and aluminum (Al) layered together. The gate electrode 115 is a Schottky electrode including, for example, platinum (Pt) and gold (Au) layered together.

Figure 10A:
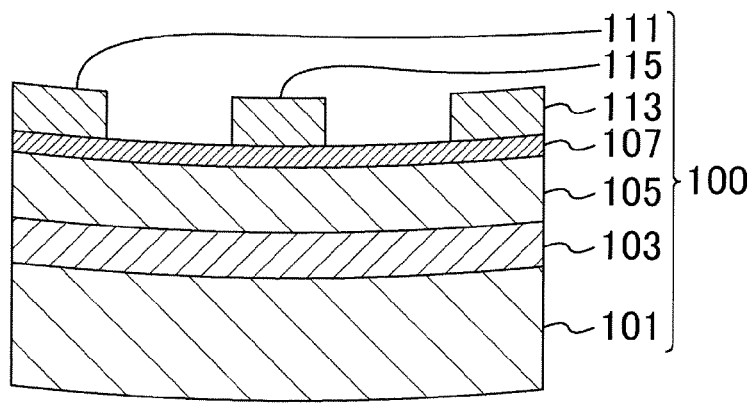
FIGS. 10A-10C are cross-sectional views showing, step by step, a method for manufacturing a transistor assembly according to an embodiment.

Next, a method for mounting the HEMT 100 of the present embodiment will be described with reference to FIGS. 10A-10C. First, as shown in FIG. 10A, the HEMT 100 is formed using a known method.

Figure 10B:
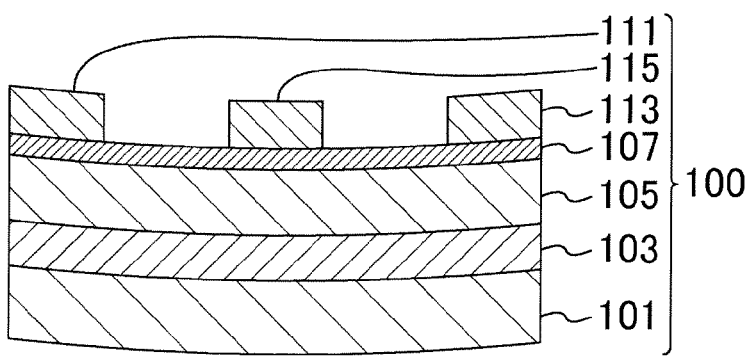

Next, as shown in FIG. 10B, the base substrate 101 of the HEMT 100 is polished to a smaller thickness, from the side of the surface (reverse surface) opposite to the surface on which the nitride semiconductor layer is formed. The amount of the base substrate 101 polished may be determined based on the degree of warp of the base substrate 101, the thickness of the base substrate before the polish, etc. For example, with an Si substrate having a thickness of 525 μm, it is preferably polished by about 200 μm.

Figure 10C:
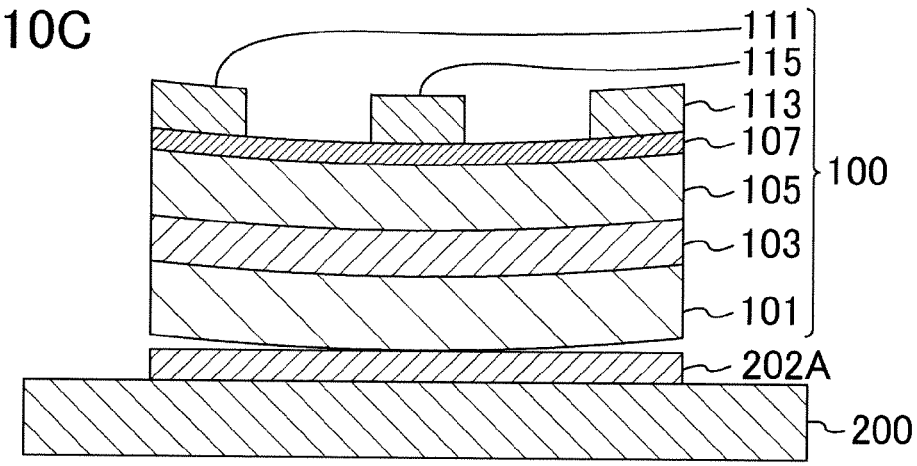

Next, as shown in FIG. 10C, solder placed on the support substrate 200 is melted to obtain a molten solder layer 202A. Then, the HEMT 100 is placed on the molten solder layer 202A.

Figure 11A:
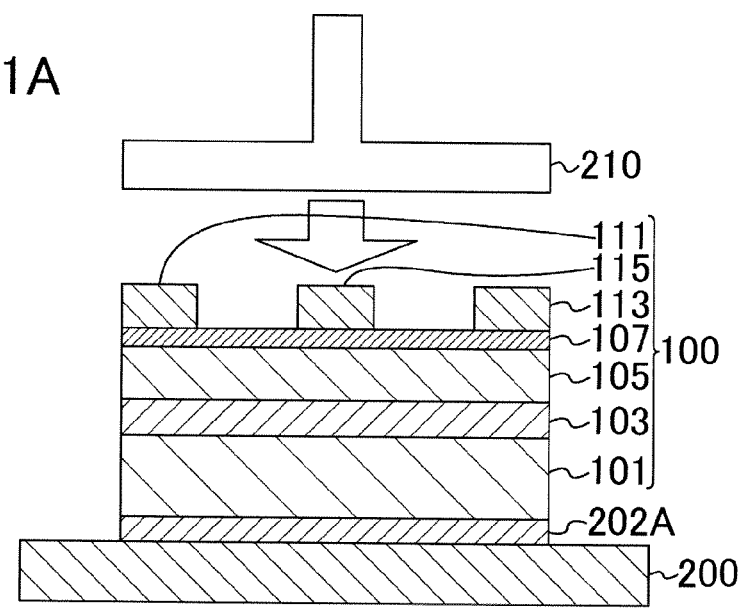
FIGS. 11A-11C are cross-sectional views showing, step by step, a method for manufacturing a transistor assembly according to an embodiment.

Next, as shown in FIG. 11A, a stress is applied on the HEMT 100 placed on the support substrate 200 using a press pad 210, thereby reducing the warp of the base substrate 101.

Figure 11B:
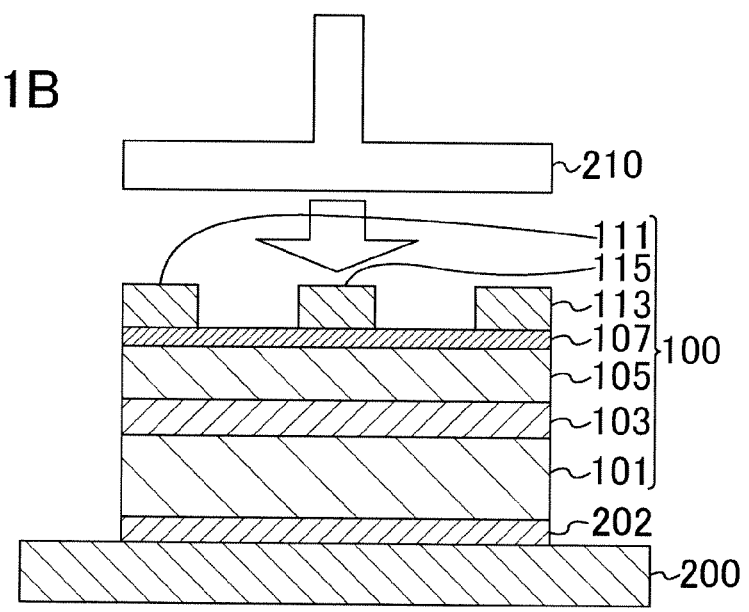

Next, as shown in FIG. 11B, the assembly is cooled in the presence of the pressure applied on the HEMT 100, thereby solidifying the solder layer 202.

Figure 11C:
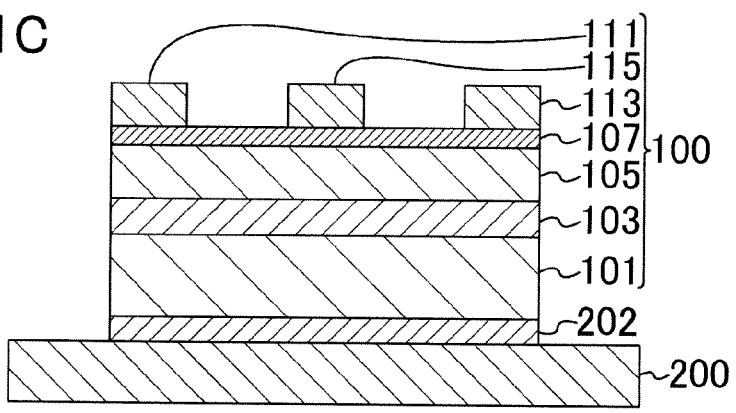

Thus, the HEMT 100 can be secured on the support substrate 200 while keeping the warp of the base substrate 101 reduced as shown in FIG. 11C.

In this way, the HEMT 100 can be secured on the support substrate 200 with the warp of the base substrate 101 reduced not only when the upper surface side of the base substrate 101 is warped in a downwardly-protruding shape but also when it is warped in an upwardly-protruding shape. Also when an adhesive other than solder is used, the HEMT 100 can be secured on the support substrate 200 while keeping the warp of the base substrate 101 small. While an example where a stress is applied on the HEMT 100 using the press pad 210 has been illustrated, any other method may be used as long as the HEMT 100 is not damaged.

The target degree of warp of the base substrate 101 may be determined based on the desirable value of the channel resistance or the desirable value of the current collapse degree. As described above, by setting the radius of curvature of the base substrate 101 after assembly is set to be greater than or equal to 12000 m, the value of the channel resistance can be reduced to be about ½ that before assembly. The current collapse degree is reduced by about seven to eight orders of magnitude. On the other hand, by reducing the warp, the lattice constant of the nitride semiconductor of the first semiconductor layer 105 can be brought closer to the theoretical value. By setting the lattice constant of the nitride semiconductor of the first semiconductor layer 105 to be 99.9% or more and 100.1% or less of the theoretical value, it is possible to reduce the value of the channel resistance to be about ½ that before assembly and to reduce the current collapse degree by about seven to eight orders of magnitude.

When an HEMT is used in applications such as power control, a high breakdown voltage is required. In order to improve the breakdown voltage of an HEMT, it is important not only to increase the source-drain breakdown voltage, but also to increase the source-substrate breakdown voltage and the drain-substrate breakdown voltage. This is because if a high voltage is applied between the source and the drain, a breakdown occurs between the source and the drain through the conductive base substrate. In order to increase the source-substrate breakdown voltage and the drain-substrate breakdown voltage, it is necessary to increase the thickness of the first semiconductor layer 105. For example, where the first semiconductor layer 105 is GaN having a thickness of 1 μm, the source-substrate breakdown voltage and the drain-substrate breakdown voltage are less than or equal to 400 V. It is preferred that the thickness of the first semiconductor layer 105 is 3 μm or more in order to set the breakdown voltage of the HEMT to be 600 V or more, and the thickness of the first semiconductor layer 105 is 4 μm or more if a breakdown voltage of 800 V or more is required.

If the thickness of the first semiconductor layer 105 is increased in order to increase the breakdown voltage of the HEMT, the stress acting on the base substrate increases and the warp of the base substrate increases, and it is very unlikely that the radius of curvature exceeds 12000 m. Therefore, in order to reduce the warp of the base substrate and to set the radius of curvature to be greater than or equal to 12000 m, it is necessary to apply a stress from outside. FIGS. 12A-12D show the distribution of the radius of curvature of the base substrate in a case where the thickness of the first semiconductor layer 105 is set to be 3 μm. FIG. 12A shows the frequency with which the upper surface side including a nitride semiconductor layer formed thereon is warped in an upwardly-protruding shape as shown in FIG. 12C. FIG. 12B shows the frequency with which the upper surface side including a nitride semiconductor layer formed thereon is warped in a downwardly-protruding shape as shown in FIG. 12D. As shown in FIGS. 12A-12D, the upper surface side of the base substrate was more often warped in an upwardly-protruding shape than it was warped in a downwardly-protruding shape, and the average radius of curvature was about 150 m. As is clear from FIGS. 12A-12D, it is very difficult, only by growing GaN on an Si substrate, to realize an HEMT with such a small warp that the radius of curvature exceeds 12000 m.

As described above, if the thickness of the first semiconductor layer 105 is increased in order to increase the breakdown voltage of the HEMT, the warp of the base substrate increases and the radius of curvature decreases. Therefore, the method of the present embodiment for securing an HEMT on a support substrate in the presence of a stress applied on a base substrate so as to reduce the warp is particularly useful.

Variation of Embodiment

Figure 13:
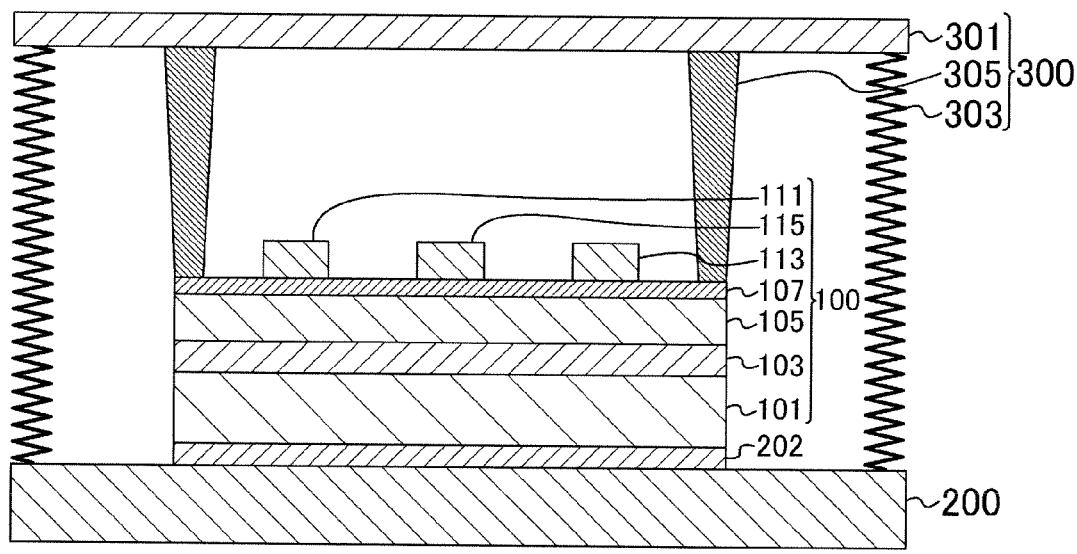
FIG. 13 is a cross-sectional view showing an example of a transistor assembly according to a variation of an embodiment.

A variation of the embodiment will be described with reference to the drawings. FIG. 13 shows a cross-sectional structure of a transistor assembly of this variation. In FIG. 13, like elements to those of FIG. 9 will be denoted by like reference numerals and will not be further described below. As shown in FIG. 13, a stress is applied on the base substrate 101 of the transistor assembly of this variation by using a stress application jig 300.

It is only required that the stress application jig 300 is capable of applying a stress on the base substrate 101 and maintaining the applied stress. For example, the stress application jig 300 includes a press pad 301 provided so as to oppose the support substrate 200 with the HEMT 100 interposed therebetween, a press section 303 which is a spring for pulling the press pad 301 toward the support substrate 200, and a press support pillar 305 provided between the press pad 301 and the HEMT 100. An optimal stress can be applied on the HEMT 100 by adjusting the strength of the spring of the press section 303 connecting between the press pad 301 and the support substrate 200. By cooling and solidifying the solder layer 202 while a stress is applied and the warp of the base substrate 101 is reduced, it is possible to secure the HEMT 100 on the support substrate 200 while keeping the warp of the base substrate 101 reduced. The press section 303 is not limited to a spring and may be another elastic member as long as it is possible to apply a necessary stress on the press pad 301.

Figure 14:
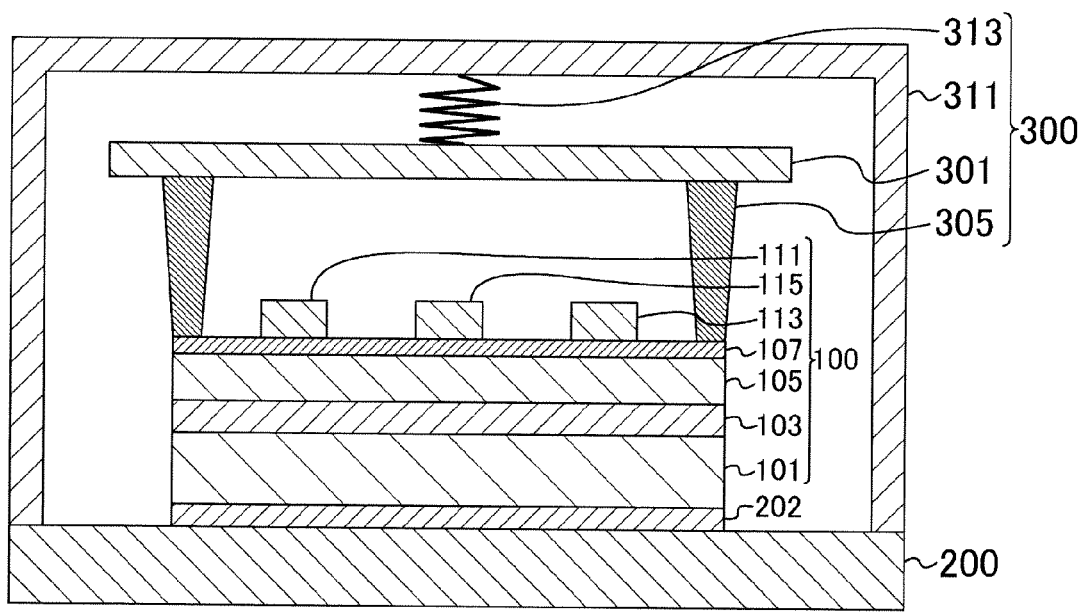
FIG. 14 is a cross-sectional view showing an example of a transistor assembly according to a variation of an embodiment.

It is only required for the stress application jig 300 that the HEMT 100 can be pressed toward the support substrate 200. Therefore, instead of pulling the press pad 301 toward the support substrate 200, the press pad 301 may be pressed toward the support substrate 200 as shown in FIG. 14. In such a case, a press section may be used which includes a frame 311 fixed to the support substrate 200, and an elastic member 313 such as a spring provided between the frame 311 and the press pad 301. Alternatively, the press pad 301 may be pressed by using a clamp mechanism using a screw, instead of an elastic member such as a spring.

Figure 15:
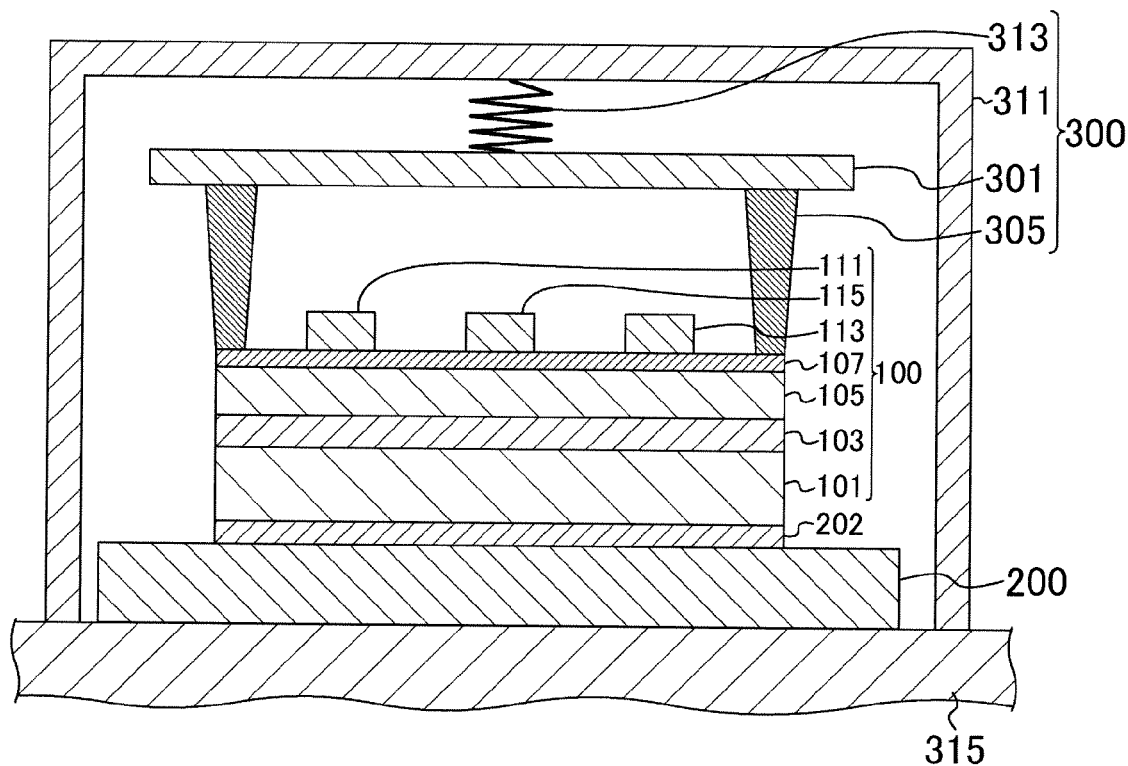
FIG. 15 is a cross-sectional view showing an example of a transistor assembly according to a variation of an embodiment.

Note that the stress application jig 300 is used to apply a stress on the HEMT 100 to reduce the warp of the base substrate 101 when mounting the HEMT 100 on the support substrate 200. Therefore, the stress application jig 300 may be removed after mounting the HEMT 100 on the support substrate 200. In such a case, the stress application jig 300 does not need to be fixed to the support substrate 200. As shown in FIG. 15, the frame 311 may be fixed to a flat plate 315 having the support substrate 200 placed thereon. Reversing the operation upside down, the pressing may be done from the side of the support substrate 200.

Figure 16:
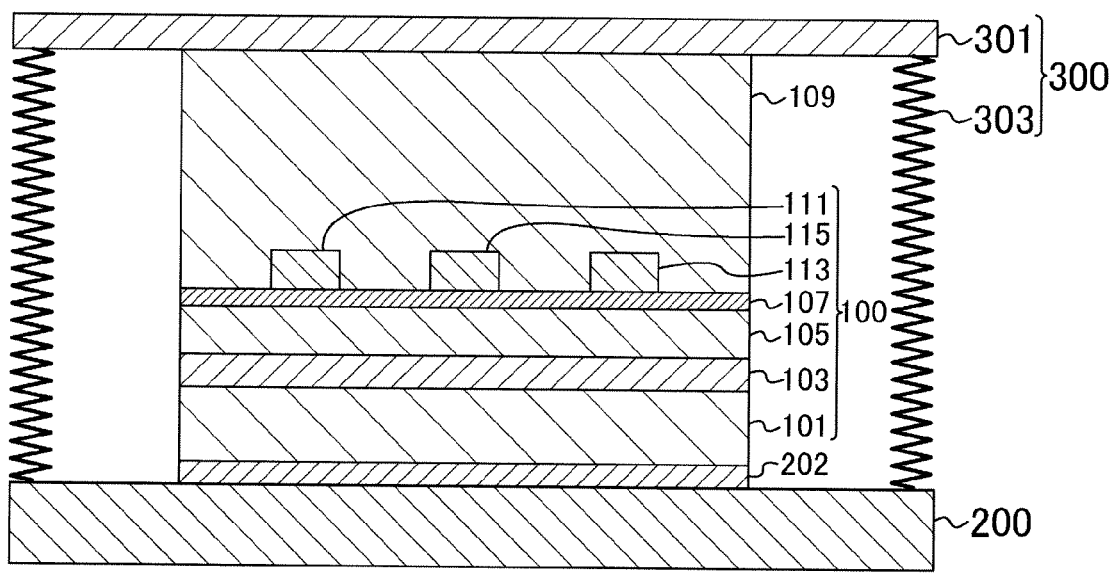
FIG. 16 is a cross-sectional view showing an example of a transistor assembly according to a variation of an embodiment.
Figure 17:
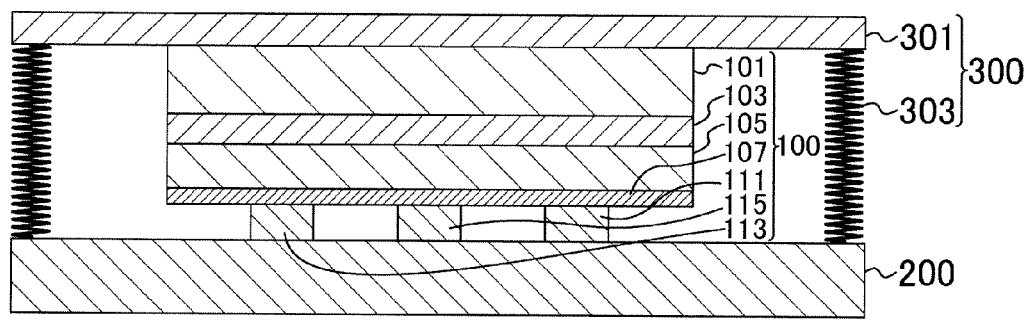
FIG. 17 is a cross-sectional view showing an example of a transistor assembly according to a variation of an embodiment.
Figure 18:
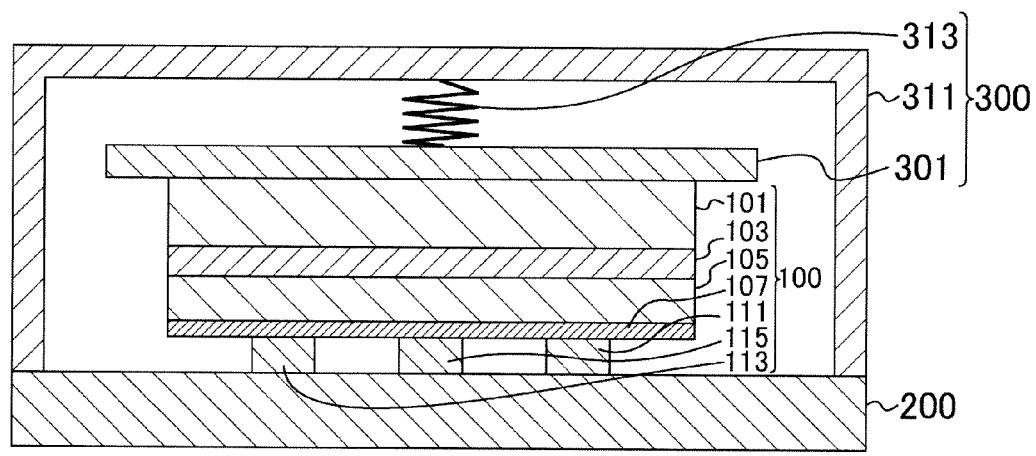
FIG. 18 is a cross-sectional view showing an example of a transistor assembly according to a variation of an embodiment.

While the HEMT 100 is pressed using the press support pillar 305 in FIGS. 13 to 15, the HEMT 100 may be pressed directly by the press pad 301. In such a case, in order to protect the surface of the HEMT 100 as shown in FIG. 16, a protection film 109 may be formed on the second semiconductor layer 107. As shown in FIGS. 17 and 18, the pressing may be done from the side of the base substrate 101.

In FIGS. 13 to 18, the stress application jig 300 applies a stress on the HEMT 100 by using the press pad 301 and the support substrate 200. However, a stress may be applied on the HEMT 100 by using the press pad 301 and a substrate for pressing which is different from the support substrate 200. In such a case, the assembly, together with the substrate for pressing, may be secured on the support substrate 200.

Figure 19:
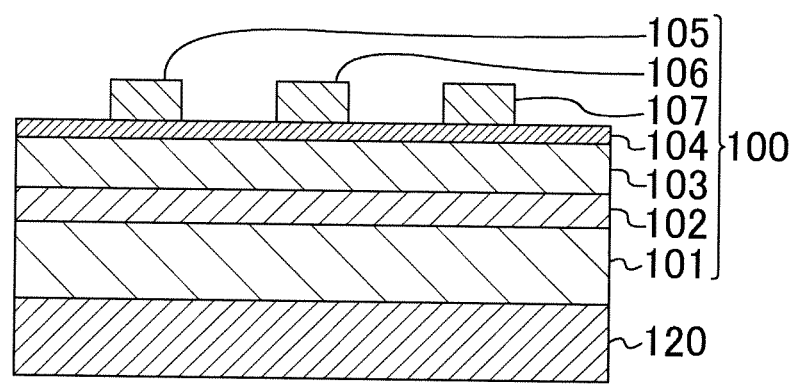
FIG. 19 is a cross-sectional view showing an example of a transistor used in a transistor assembly according to a variation of an embodiment.

The protection film 109 may be a stress-applying film for applying a stress on the HEMT 100. Then, since a stress is applied on the base substrate 101 by the stress-applying film, it is possible to reduce the warp of the base substrate 101 without pressing. In such a case, the HEMT 100 can be secured directly on the support substrate 200 without pressing the HEMT 100 using a stress application jig, a pad, or the like. When the stress-applying film is formed, the warp of the base substrate can be further reduced by using pressing in combination with the stress-applying film. The stress-applying film may be a polymer film such as a polymethyl methacrylate (PMMA) film, etc. A stress-applying film 120 may be provided on the reverse surface of the base substrate 101 as shown in FIG. 19 instead of on the second semiconductor layer 107.

Examples where the base substrate is an Si substrate have been described above in the embodiment and the variation thereof. However, the present disclosure is applicable as long as it is a substrate which is warped following the formation of a nitride semiconductor layer due to a difference in lattice constant and coefficient of thermal expansion from a nitride semiconductor. Therefore, similar effects can be obtained when using a substrate of a material other than a nitride semiconductor. Thus, a sapphire substrate, a silicon carbide (SiC) substrate, a silicon on insulator (SOI) substrate, or the like, may be used instead of an Si substrate.

While examples where GaN is used as the first semiconductor layer 105 and AlGaN is used as the second semiconductor layer 107 have been illustrated above, the nitride semiconductor layer may be of any composition as long as the bandgap of the second semiconductor layer 107 can be made greater than the bandgap of the first semiconductor layer 105. For example, a nitride semiconductor layer of any composition that includes at least one of In, Ga and Al and N as constituent elements may be used. The compound semiconductor is not limited to a binary or ternary compound semiconductor, but may be a compound semiconductor of four or more elements. The configuration of the electrode, etc., may be changed as necessary as long as it s an HEMT including a nitride semiconductor layer having a hetero junction interface.

Moreover, while the present disclosure has been described above as an HEMT using a nitride semiconductor in the embodiment and the variation thereof, it is clear that the present disclosure is applicable as long as it is a system where 2DEG is generated due to a piezoelectric effect. Therefore, the configuration illustrated in the embodiment and the variation thereof can be applied also to cases where a material other than a nitride semiconductor is used. For example, the present invention can be applied to a semiconductor device where ZnO is used in the first semiconductor layer 105 and ZnMgO is used in the second semiconductor layer 107, and where 2DEG generated at the interface between ZnO and ZnMgO is utilized.

While solder is used as a means for bonding together the HEMT and the support substrate in the embodiment and the variation thereof, the present invention is not limited thereto. For example, by polishing an HEMT formed on an Si substrate on the Si substrate side thereof by 200 µm, placing the HEMT on a support substrate of Si having a thickness of 5 mm, and annealing the HEMT in a hydrogen atmosphere while applying a pressure by a method illustrated in the embodiment and the variation thereof, it is possible to bond the HEMT to the support substrate while the warp thereof is reduced.

As described above, a transistor assembly of the present disclosure and a method for manufacturing the same, with which it is possible to realize a field effect transistor assembly with a significantly reduced channel resistance, are particularly useful as an assembly of a field-effect transistor such as a power transistor using a nitride semiconductor, a method for manufacturing the same, etc.

What is claimed is:

1. A method for manufacturing a transistor assembly, comprising the steps of:
    (a) forming a transistor including a first semiconductor layer and a second semiconductor layer having a greater bandgap than the first semiconductor layer, layered in this order on a principle surface of a base substrate;
    (b) polishing a surface of the base substrate opposite to the principle surface thereof, after the step (a); and
    (c) securing the transistor on a support substrate in the presence of a stress applied on the base substrate in such a direction that a warp of the base substrate is reduced, after the step (b), wherein
    the base substrate is made of a material different from that of the first semiconductor layer and the second semiconductor layer, and
    a tensile stress is applied on the second semiconductor layer.

2. The method for manufacturing a transistor assembly of claim 1, wherein
    in the step (c), after the stress is applied on the base substrate, the base substrate and the support substrate are bonded together while maintaining the stress.

3. The method for manufacturing a transistor assembly of claim 2, wherein
    the stress is applied by pressing the transistor using a press pad.

4. The method for manufacturing a transistor assembly of claim 2, wherein
the stress is applied by pressing the transistor using a stress application jig.

5. The method for manufacturing a transistor assembly of claim 4, wherein the stress application jig includes
a press pad opposing the support substrate with the transistor interposed therebetween, and
a press section pressing the press pad toward the support substrate.

6. The method for manufacturing a transistor assembly of claim 1, wherein the step (c) includes the steps of:
forming a solder layer on the support substrate;
placing the transistor on the support substrate while the solder layer is melted;
pressing the transistor while the solder layer is melted; and
solidifying the solder layer while the transistor is pressed.

7. The method for manufacturing a transistor assembly of claim 1, wherein
in the step (c), the solidification is performed so that a value of a c-axis lattice constant of the first semiconductor layer is 99.9% or more and 100.1% or less of a theoretical value of a c-axis lattice constant of a material of the first semiconductor layer.

8. The method for manufacturing a transistor assembly of claim 1, wherein
in the step (c), the solidification is performed so that a radius of curvature of the base substrate is greater than or equal to 12000 m.

9. The method for manufacturing a transistor assembly of claim 1, further comprising the step of:
(d) forming, on the second semiconductor layer, a stress-applying film for applying a stress on the base substrate, before the step (c).

10. The method for manufacturing a transistor assembly of claim 1, further comprising the step of:
(d) forming, on a surface of the base substrate opposite to the principle surface thereof, a stress-applying film for applying a stress on the base substrate, before the step (c).

11. The method for manufacturing a transistor assembly of claim 1, wherein
the base substrate is a silicon substrate, and
the first semiconductor layer is made of gallium nitride.

* * * * *